United States Patent
Kim et al.

(10) Patent No.: US 7,729,196 B2
(45) Date of Patent: *Jun. 1, 2010

(54) APPARATUS AND METHOD FOR CONTROLLING ENABLE TIME OF SIGNAL CONTROLLING OPERATION OF DATA BUSES OF MEMORY DEVICE

(75) Inventors: Ji Hyun Kim, Seoul (KR); Young Jun Nam, Kwangju (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/654,840

(22) Filed: Jan. 18, 2007

(65) Prior Publication Data

US 2007/0121403 A1     May 31, 2007

Related U.S. Application Data

(62) Division of application No. 10/876,915, filed on Jun. 25, 2004, now Pat. No. 7,177,228.

(30) Foreign Application Priority Data

Feb. 6, 2004   (KR) .................................. 2004-7912

(51) Int. Cl.
*G11C 8/00*   (2006.01)

(52) U.S. Cl. ............... 365/233.1; 365/207; 365/233.11; 365/233.12; 365/236

(58) Field of Classification Search ................. 365/207, 365/233.1, 233.11, 233.12, 236
See application file for complete search history.

(56) References Cited

U.S. PATENT DOCUMENTS

| 6,842,033 B1* | 1/2005 | Kim et al. ................... 324/765 |
| 2004/0042334 A1* | 3/2004 | Sasaki et al. ................. 365/236 |
| 2005/0257121 A1* | 11/2005 | Kim et al. ................... 714/768 |

* cited by examiner

*Primary Examiner*—Hoai V Ho
*Assistant Examiner*—Fernando N Hidalgo
(74) *Attorney, Agent, or Firm*—Ladas & Parry LLP

(57) ABSTRACT

Disclosed is an apparatus for controlling an enable interval of a signal controlling an operation of data buses which connect a bit line sense amplifier with a data sense amplifier according to a variation of an operational frequency of a memory device. The apparatus comprises a pulse width control section for changing the pulse width of an input signal depending on the operational frequency of the memory device after receiving the input signal, a signal transmission section for buffering a signal outputted from the pulse width control section, and an output section for receiving a signal outputted from the signal transmission section so as to output a first signal for controlling the signal to control the operation of the data buses.

5 Claims, 11 Drawing Sheets

APPARATUS AND METHOD FOR CONTROLLING ENABLE TIME OF SIGNAL CONTROLLING OPERATION OF DATA BUSES OF MEMORY DEVICE

This is a divisional application of U.S. patent application Ser. No. 10/876,915, now U.S. Pat. No. 7,177,228.

BACKGROUND OF THE INVENTION

1. Field of the Invention

The present invention relates to a method for controlling the operation of a sense amplifier for a memory device, and more particularly to a method capable of controlling an operation period of a sense amplifier according to variation of an operational frequency of a memory device.

2. Description of the Prior Art

FIG. 1 is a view for explaining a read operation and a write operation of a general memory device.

As shown in FIG. 1, during the write operation, data applied through an input/output data pad are transferred to a bit line sense amplifier through a data input buffer, a data input register, and a write driver. Also, during the read operation, cell data amplified by the bit line sense amplifier are transferred to the input/output data pad through a data sense amplifier, a pipe register, and a data output buffer.

In FIG. 1, signal "Yi" is a pulse signal for controlling the operation of data buses which connect the bit line sense amplifier with the data sense amplifier. While the signal "Yi" controlling the data buses is enabled, write data are transferred from the write driver to the bit line sense amplifier, and read data are transferred from the bit line sense amplifier to the data sense amplifier. Therefore, in order to transfer valid data during an active operation, that is, during the read operation or the write operation, the wider pulse width of the signal "Yi" is, the more profitable it becomes. This permits data to be better restored under the same "tDPL" condition, thereby also obtaining an effect of improving the "tDPL, in which the "tDPL" is a time interval from a time when a CAS pulse is generated internally by a write command to a time when a precharge pulse signal is generated internally by a precharge command. Therefore, in most cases, the pulse width of the signal "Yi" is set as large as possible and the pulse width of the signal "Yi" is reduced in use if necessary. For reference, when the operational frequency of a memory device increases, that is, when the clock period decreases, the tolerable pulse width of the signal "Yi" decreases.

Herein, the above-mentioned signal "Yi" is created by receiving a read/write strobe pulse signal "rdwtstbzp13" outputted from a read/write strobe pulse generating circuit, so the description of a read/write strobe pulse generating circuit will be followed.

FIG. 2A is a circuit diagram illustrating an example of a conventional read/write strobe pulse generating circuit, and FIG. 2B is a waveform view for explaining the operation of the circuit shown in FIG. 2A.

In FIG. 2A, signal "extyp8" and signal "icasp6" are used for making a "short" status or an "open" status between a data transmission line of a memory cell array and a data transmission line of a peripheral circuit so as to read data stored in the cell array (core region) of a memory device into the peripheral circuit and to write data applied from the peripheral circuit into the memory cell array. For convenience of description, it will be defined that one region, which includes a memory cell and a bit line sense amplifier, is called a core region, and the other region is called a peripheral circuit.

To be more specific, the signal "extyp8" is a pulse signal generated in synchronization with a clock signal when a read or a write command (burst command) is applied from outside. The signal "icasp6" is used to operate the memory device through creating a self burst operation command corresponding to a burst length, which is preset by MRS, from a point of a predetermined clock created later than a clock, to which the read or write command is applied from an exterior, by 1 period.

Signal "rdwtstbzp13" is enabled by an entire burst length which is determined by the MRS in synchronization with a burst operation command whenever the burst operation command (External=extyp8&Internal=icasp61) is enabled. That is, the signal "rdwtstbzp13" represents an activation time of an input/output sense amplifier, which is used to sufficiently amplify data transmitted from the core region into the peripheral circuit so as to transmit output data to a buffer. Also, the signal "rdwtstbzp13" is to reset a data transmission line of the peripheral circuit after amplification and transmission of data is completed.

Signal "pwrup" is used to set an initial value and is maintained at a low level after falling down to the low level from a high level. Signal "term_z" is to be used during a test mode and is maintained at a low level during a normal operation. Signal "tm_clkpulsez" is to be used during the test mode. These signals will be described in more detail when the present invention is described.

The circuit operation of FIG. 2A will be described with reference to the waveform view shown in FIG. 2B.

As shown in FIG. 2B, when a read/write command is created in synchronization with a clock signal, the pulse signal "extyp8" is generated. When the pulse signal "extyp8" is generated, a plurality of pulses "icasp6" are sequentially generated in synchronization with the following clocks. As shown in this drawing, a read/write strobe pulse signal is generated in synchronization with rising edges of the pulse signals "extyp8" and "icasp6".

Referring to the conventional circuit of FIG. 2, it is understood that a pulse width control section 200 determining a pulse width of the read/write strobe pulse signal "rdwtstbzp13" has been set regardless of an operational frequency of the memory device. That is, a delay time of a delay unit 20 in the pulse width control section 200 is fixed, so that there is no alternative but to output a signal having a constant pulse width from the pulse width control section 200.

However, in the case in which the operational frequency of the memory device is varied, it is necessary to control the pulse width of the read/write strobe pulse signal "rdwtstbzp13".

Conventionally, when the operational frequency of the memory device is varied, it is necessary to adjust the delay time of the delay unit 20 by correcting a metal option during FIB work. However, such a conventional method may cause an expensive cost and much time.

SUMMARY OF THE INVENTION

Accordingly, the present invention has been made to solve the above-mentioned problems occurring in the prior art, and an object of the present invention is to provide a method for automatically controlling the pulse width of a signal outputted from a pulse width control section depending on variation of an operational frequency of a memory device.

Another object of the present invention is to provide a method for controlling the pulse width of a read/write strobe pulse signal "rdwtstbzp13" depending on variation of an external clock signal.

Still another object of the present invention is to provide a read/write strobe pulse generating circuit, which is commonly used even if an operational frequency of a memory device varies.

Still another object of the present invention is to provide a method for delaying a pulse signal outputted from the read/write strobe pulse generating circuit and for controlling the width of the pulse signal by applying an external address signal during a test mode.

In order to accomplish this object, there is provided a method for controlling an enable interval of a signal controlling an operation of data buses which connect a bit line sense amplifier with a data sense amplifier according to a variation of an operational frequency of a memory device, the method comprising the steps of: (a) receiving an input signal; (b) receiving the input signal and changing the pulse width of the input signal depending on a variation of a frequency of a clock signal of the memory device, thereby outputting a first signal; and (c) controlling the pulse width of the signal controlling the operation of the data buses which connect the bit line sense amplifier with the data sense amplifier by using the first signal.

In addition, step (b) may further comprise a step of additionally controlling the pulse width of the first signal by using an address signal.

In accordance with another aspect of the present invention, there is provided an apparatus for controlling an enable interval of a signal controlling an operation of data buses which connect a bit line sense amplifier with a data sense amplifier according to a variation of an operational frequency of a memory device, the apparatus comprising: a pulse width control section for changing the pulse width of an input signal depending on the operational frequency of the memory device after receiving the input signal; a signal transmission section for buffering a signal outputted from the pulse width control section; and an output section for receiving a signal outputted from the signal transmission section so as to output a first signal for controlling the signal to control the operation of the data buses.

In addition, the pulse width control section receives a clock signal of the memory device in order to judge a range of the operational frequency of the memory device.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
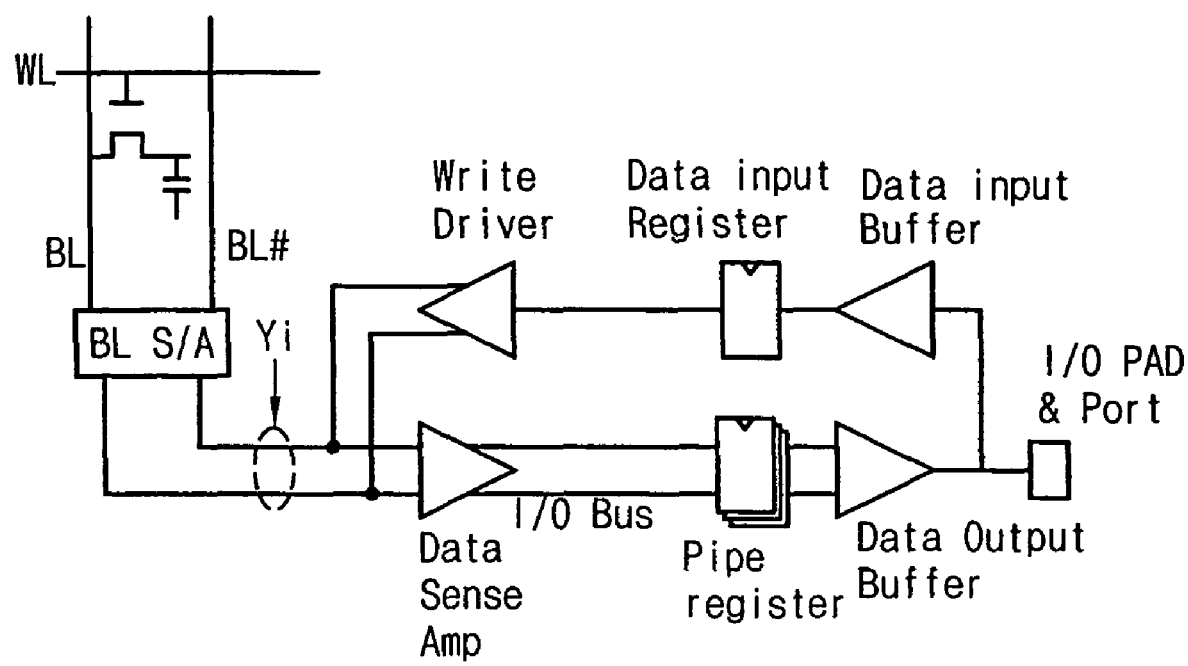
FIG. 1 is a view for explaining a read operation and a write operation of a general memory device.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
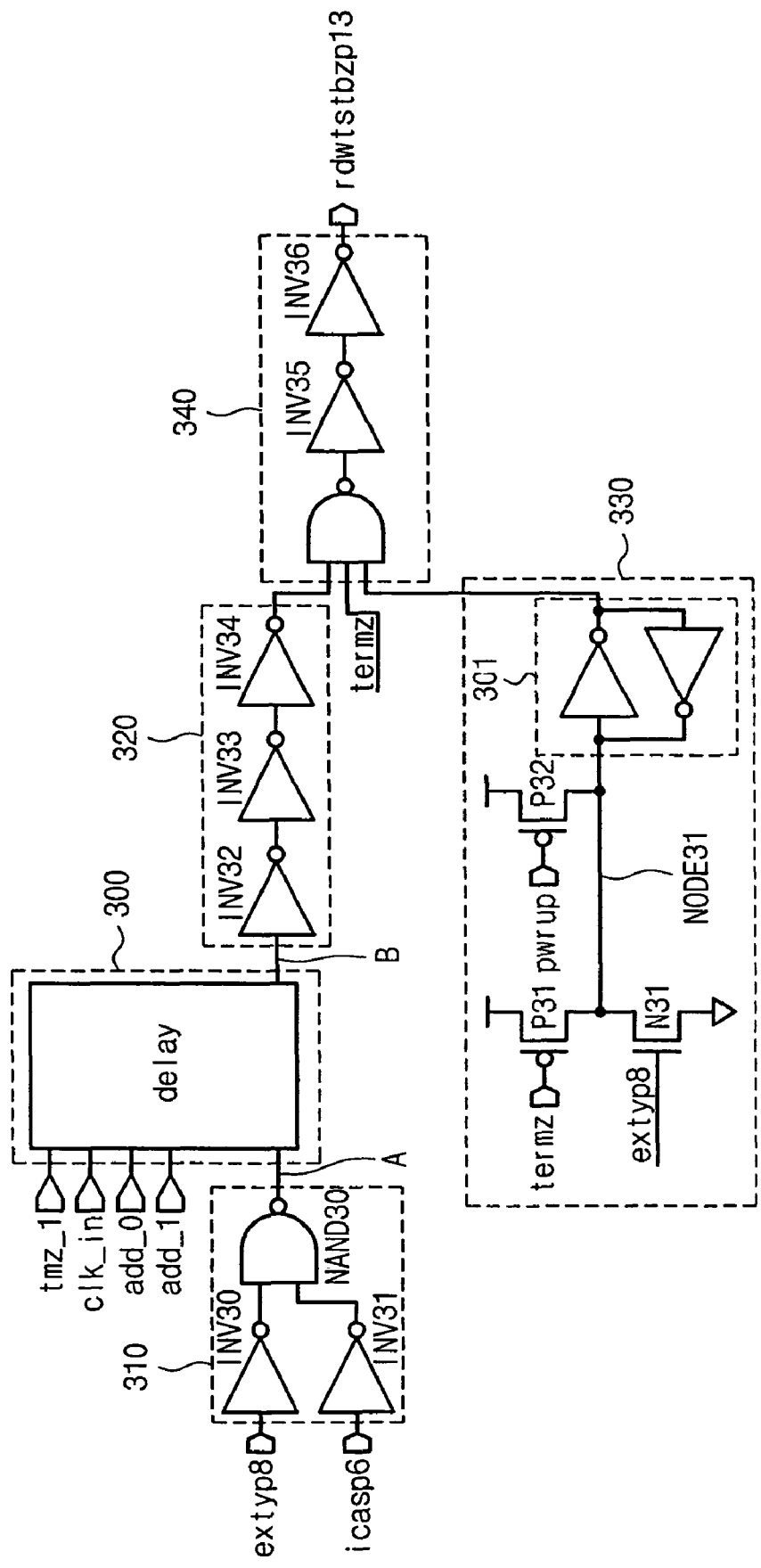
FIG. 3 is a circuit diagram illustrating a read/write strobe pulse generating circuit according to one embodiment of the present invention.

FIG. 3 is a circuit diagram illustrating a read/write strobe pulse generating circuit according to one embodiment of the present invention.

Figure 2A:
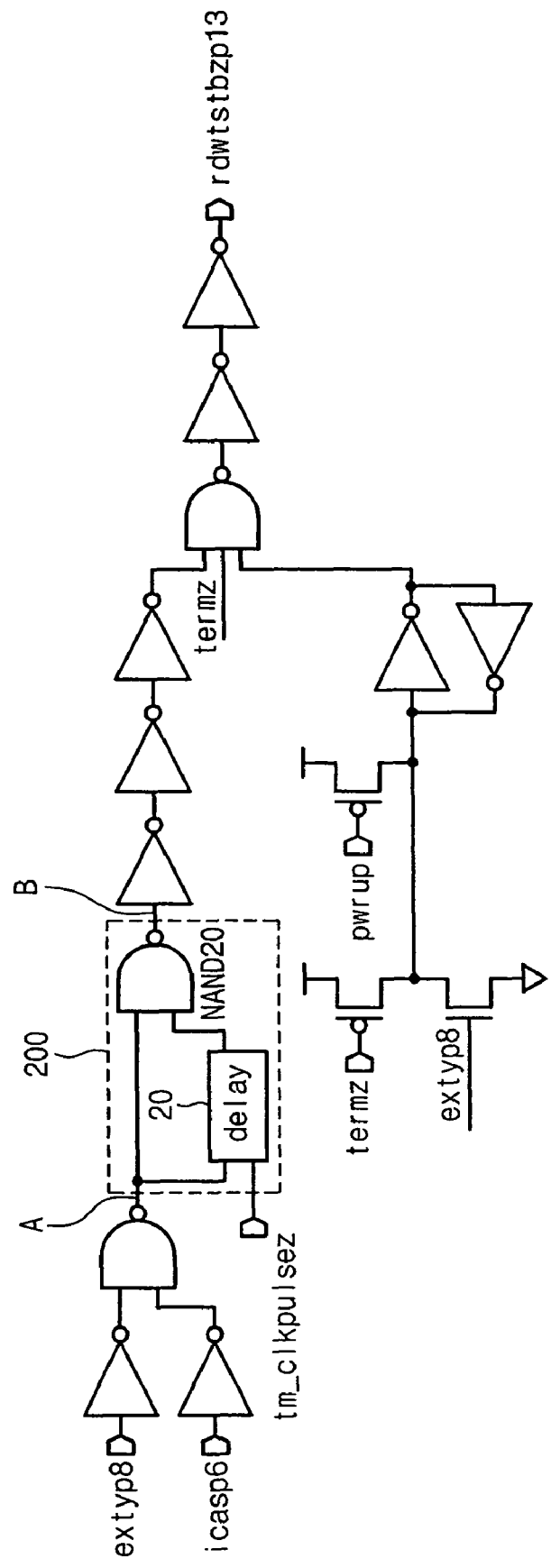
FIG. 2A is a circuit diagram illustrating an example of a conventional read/write strobe pulse generating circuit.
Figure 2B:
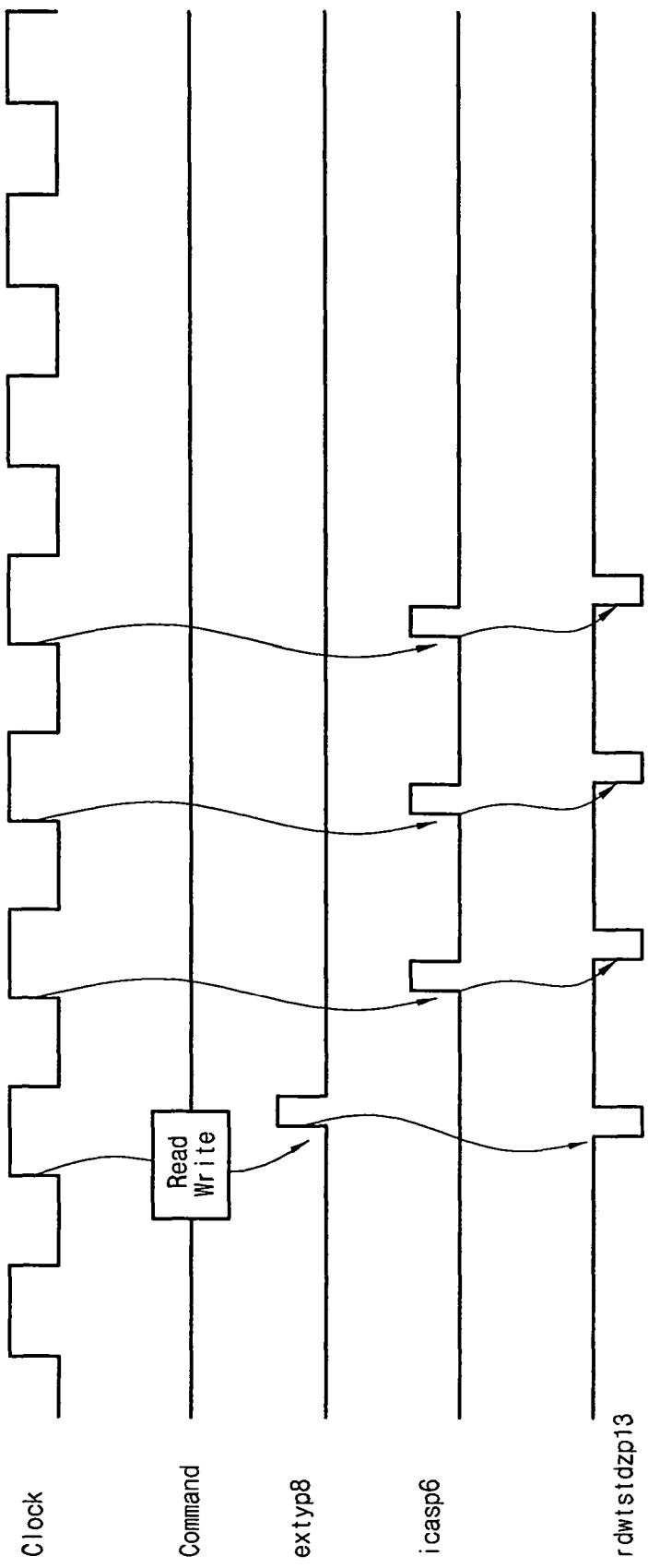
FIG. 2B is a waveform view for explaining the operation of the circuit shown in FIG. 2A.

In comparison with the circuit of FIG. 2A, the circuit shown in FIG. 3 has a different feature in that a pulse width control section 300 is controlled by a clock signal "clk-in".

The circuit of FIG. 3 includes an input signal receiving section 310, the pulse width control section 300, a signal transmission section 320, a circuit section 330 for a test mode, and an output section 340.

The input signal receiving section 310 includes inverters INV30 and INV31 and a NAND gate NAND30. An input signal "extyp8" is applied into the inverter INV30, and an input signal "icasp6" is applied into the inverter INV31. Output signals of the inverters INV30 and INV31 are applied into the NAND gate NAND30.

The pulse width control section 300 receives an output signal of the NAND gate NAND30, a test mode signal "tmz_1", a clock signal "clk_in", and address signals "add_0" and "add_1". The output signal of the NAND gate NAND30 is applied into the pulse width control section 300 through node A, and then outputted through node B after being delayed for a predetermined period of time. At this time, it is possible to change the pulse width of a signal outputted through node B by using the clock signal "clk_in". For reference, the test mode signal "tmz_1" is a control signal for determining whether or not a current state is in a test mode. The test mode is maintained while the test mode signal "tmz_1" has a low level, and test mode signal "tmz_1" is maintained at a high level during a normal operation mode. The address signals "add_0" and "add_1" are external address signals and used during the test mode. The functions of these signals will be described in detail with a specific circuit in the following description.

The signal transmission section 320 includes inverters INV32, INV33, and INV34 for receiving and buffering a signal outputted from the pulse width control section.

The circuit section 330 for the test mode includes transistors P31, P32, and N31, and a latch section 301. That is, as shown in the drawing, the circuit section 330 for the test mode includes a PMOS transistor P31 and an NMOS transistor N31 connected in series between a power supply voltage and ground, a PMOS transistor P32 connected between a power supply voltage and node NODE31, and a latch section 301 for latching a signal of node NODE31. In FIG. 3, 'termz' is a signal used for the test mode, and signal "pwrup" has been already described in FIG. 2A.

The output section 340 includes a NAND gate 302 and inverters INV35 and INV36. The NAND gate 302 receives an output signal of the inverter INV34, the signal "termz", and an output signal of the latch section 301. Herein, the signal "termz" functions to shield the read/write strobe pulse signal "rdwtstbzp13". An output signal of the NAND gate 302 is applied into the inverters INV35 and INV36 which are connected in series with each other. An output signal of the inverter INV36, which is an output signal of the output section 340, is the read/write strobe pulse signal "rdwtstbzp13".

During a normal operation mode, the input signals "extyp8" and "icasp6" are outputted as a read/write strobe pulse signal "rdwtstbzp13" after a predetermined period of time lapses. In this case, the pulse width control section 300 controls the pulse width of the input signals "extyp8" and "icasp6" applied through node A by using a clock signal "clk_in" which is changed depending on variation of an operational frequency, and thereby the pulse width of the read/write strobe pulse signal "rdwtstbzp13" can be controlled.

Figure 4:
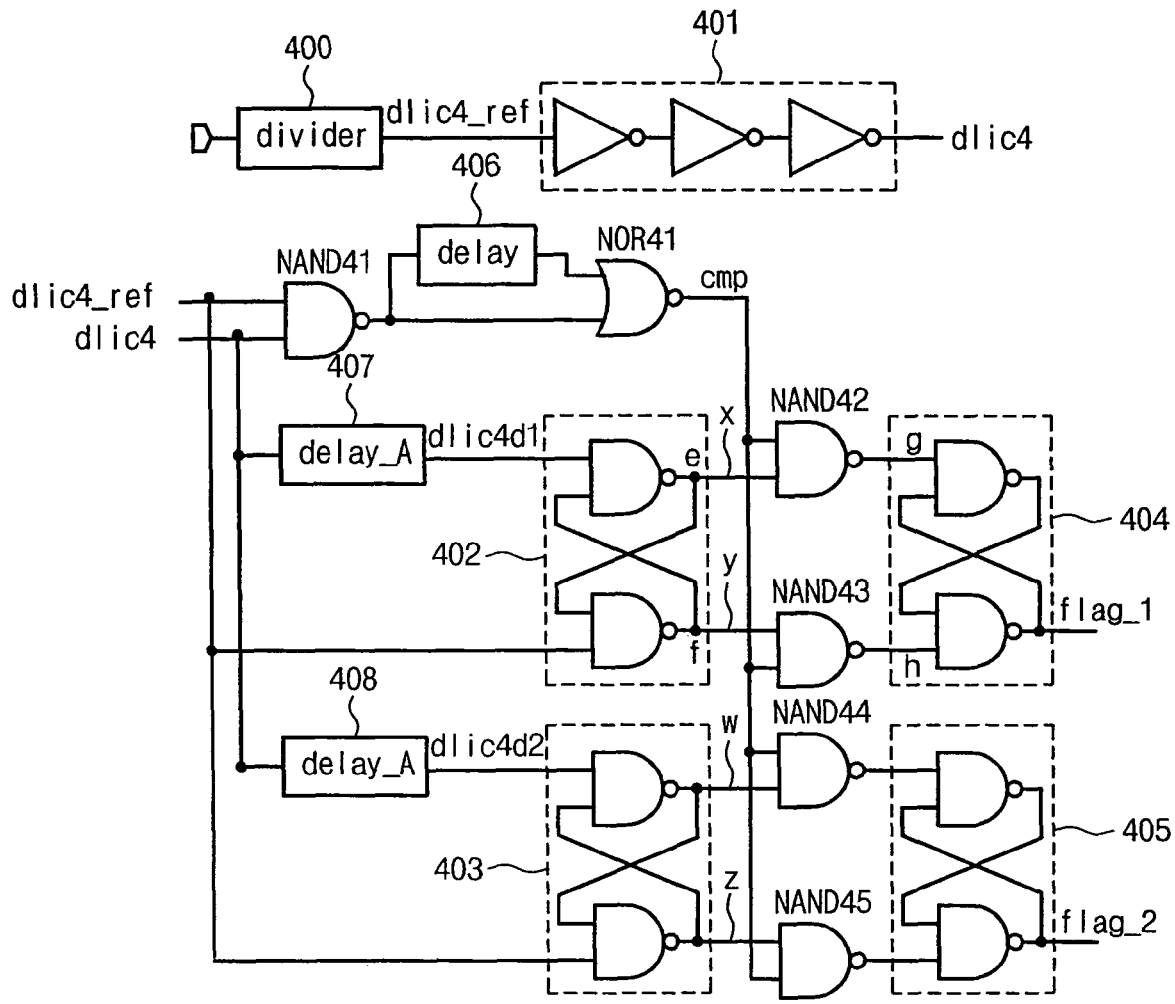
FIGS. 4 to 6 are circuit diagrams illustrating an example of a pulse width control section shown in FIG. 3.
Figure 4:
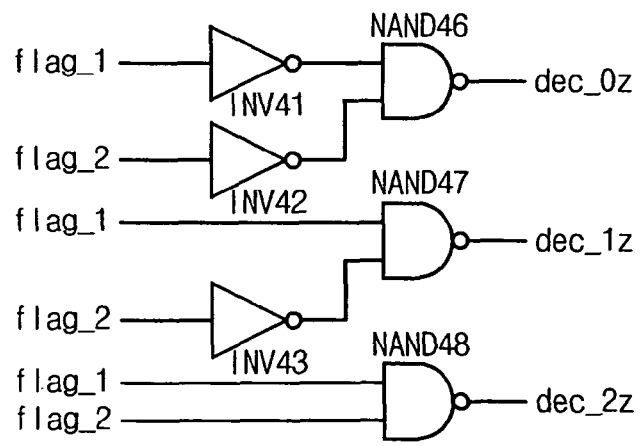
Figure 5:
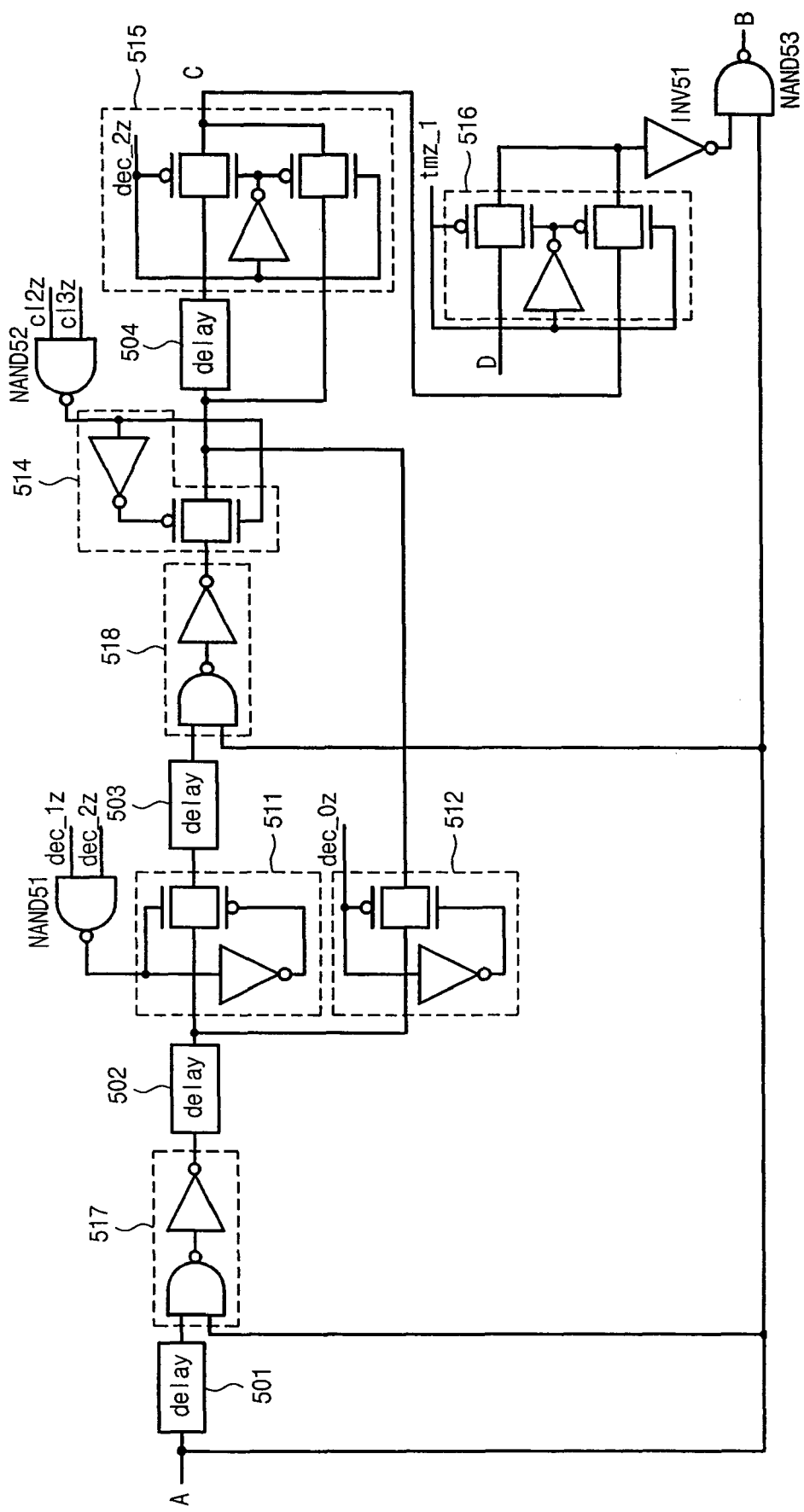
Figure 6:
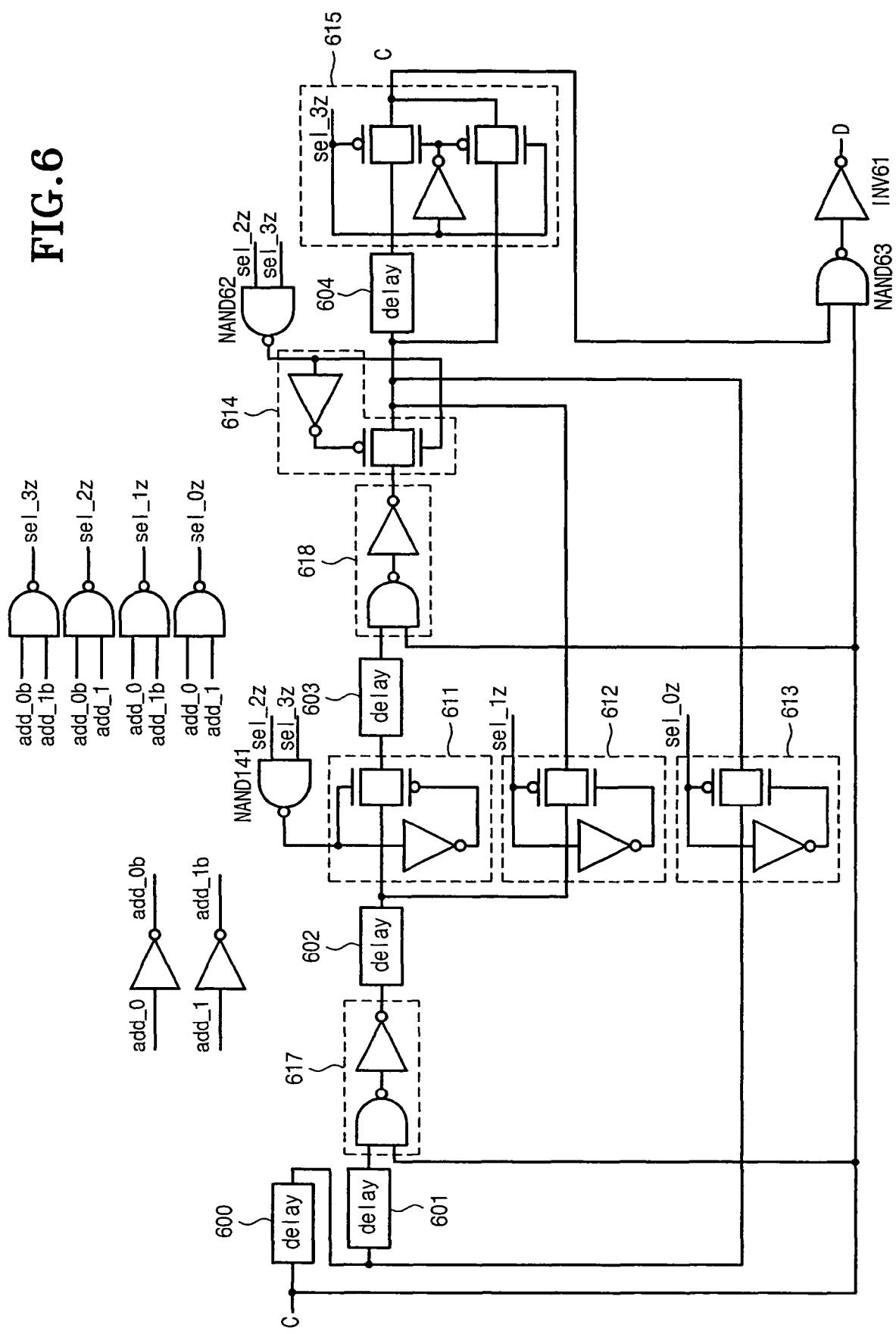

FIGS. 4 to 6 are circuit diagrams illustrating an example of the pulse width control section 300 shown in FIG. 3. As described later in this document, in order to detect an operational frequency of the memory device, the clock signal "clk_in" is applied into the pulse width control section 300. Also, when entering into the test mode, a test mode signal "tmz_1" is applied into the pulse width control section 300. In addition, when entering into the test mode, the address signals "add_0" and "add_1" are applied to perform delay tuning. For reference, nodes A and B represented in FIG. 5 correspond to nodes A and B of FIG. 3, respectively. Also, nodes C and D represented in FIG. 5 correspond to nodes C and D shown in FIG. 6.

Hereinafter, circuits shown in FIGS. 4 to 6 will be described in more detail.

FIG. 4 shows a circuit which receives the clock signal "clk_in" so as to output signals "dec_0z", "dec_1z", and "dec_2z" determining an operational frequency range of the memory device. That is, the circuit shown in FIG. 4 receives the clock signal "clk_in" to create a plurality of internal signals "dlic4_ref", "dlic4", "dlic4d1", "dlic4d2", "cmp", "flag_1", and "flag_2", thereby judging an operational frequency of the memory device. Subsequently, the circuit shown in FIG. 4 outputs the operation frequency determination signals "dec_0z", "dec_1z", and "dec_2z" for determining the operational frequency of the memory device.

Figure 8:
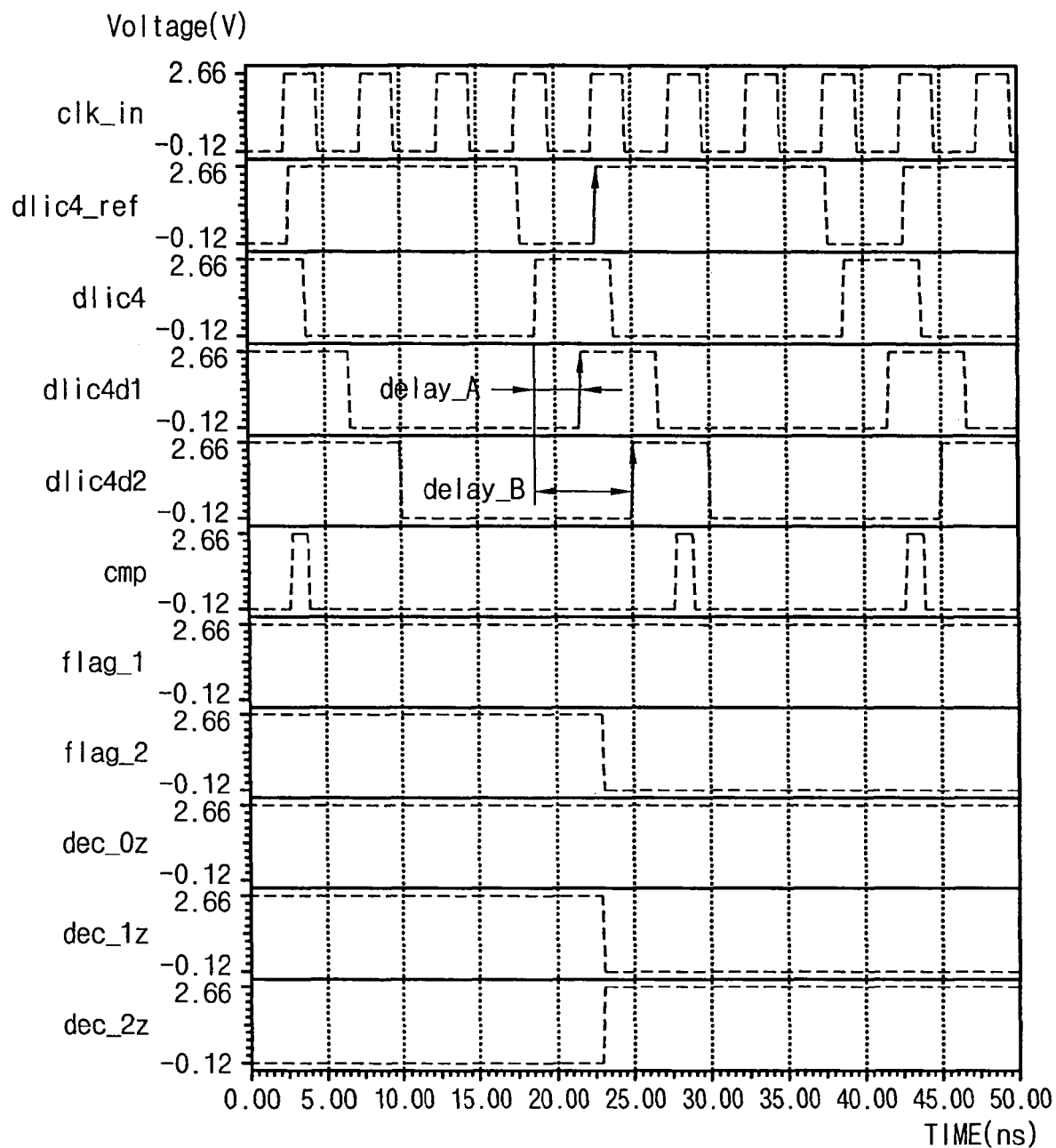
FIG. 8 is a waveform view for illustrating an example of signals used in the circuit shown in FIG. 4 according to the present invention.

As shown in FIG. 4, the clock signal "clk_in" is inputted into a frequency divider 400. The frequency divider 400 outputs a frequency-division signal "dlic4_ref" having a longer period than that of the clock signal "clk_in". As shown in a waveform view of FIG. 8, the period of the frequency-division signal "dlic4_ref" is four times as long as the clock signal "clk_in". In this case, the section of the low level of the frequency-division signal "dlic4_ref" is identical to period "tCLK" of the clock signal "clk_in". However, a person having ordinary skill in the art may control the period of the frequency-division signal "dlic4_ref" according to necessity. The frequency-division signal "dlic4_ref" is applied into a buffer means 401 including an odd number of inverters to be delayed for a predetermined period of time, and is then outputted with its phase inverted. The frequency-division signal having an inversed phase is represented as "dlic4". Waveforms of these signals "dlic4_ref" and "dlic4" are shown in FIG. 8.

Referring to FIG. 4, the frequency-division signal "dlic4_ref" and the frequency-division signal "dlic4" having an inverted phase are applied into an NAND gate NAND41. An output signal of the NAND gate NAND41 is applied into a delay section 406 and a NOR gate NOR41. The NOR gate NOR41 receives the output signal of the NAND gate NAND41 and an output signal of the delay section 406 to output the pulse signal "cmp". The output signal "cmp" of the NOR gate NOR41 is shown in FIG. 8. Also, the frequency-division signal "dlic4" having an inverted phase is applied into each of delay sections delay_A and delay_B. Herein, delay times of the delay sections delay_A and delay_B are different from each other. Output signals of the delay sections delay_A and delay_B are represented as "dlic4d1" and "dlic4d2", respectively.

The output signal "dlic4d1" of the delay section delay_A and the frequency-division signal "dlic4_ref" are applied into a flip-flop circuit 402. The flip-flop 402 includes two NAND gates and input terminals and output terminals thereof are crossed with each other. Output signals outputted from two output terminals of the flip-flop 402 are represented as "X" and "Y", respectively.

The output signal "dlic4d2" of the delay section delay_B and the frequency-division signal "dlic4_ref" are applied into a flip-flop circuit 403. The flip-flop 403 includes two NAND gates, and input terminals and output terminals thereof are crossed with each other. Output signals outputted from two output terminals of the flip-flop 403 are represented as "W" and "Z", respectively.

Subsequently, an NAND gate NAND42 receives the output signal "cmp" of the NOR gate NOR41 and the output signal "X" of the flip-flop 402. An NAND gate NAND43 receives the output signal "cmp" of the NOR gate NOR41 and the output signal "Y" of the flip-flop 402. An NAND gate NAND44 receives the output signal "cmp" of the NOR gate NOR41 and the output signal "W" of the flip-flop 403. An NAND gate NAND45 receives the output signal "cmp" of the NOR gate NOR41 and the output signal "Z" of the "flip-flop 403.

An output signal of the NAND gate NAND42 and an output signal of the NAND gate NAND42 are applied into a flip-flop 404. The flip-flop 404 includes two NAND gates, and input terminals and output terminals thereof are crossed with each other. In FIG. 4, an output signal of the flip-flop 404 is represented as "flag_1".

An output signal of the NAND gate NAND44 and an output signal of the NAND gate NAND45 are applied into a flip-flop 405. The flip-flop 405 includes two NAND gates, and input terminals and output terminals thereof are crossed with each other. In FIG. 4, an output signal of the flip-flop 405 is represented as "flag_2".

For reference, when the delay time of the delay section 408 is longer than that of the delay section 407 (that is, when "delay_A" is smaller than "delay_B"), logic levels of flag signals are as followings.

When "tCK<delay_A", both flag signals "flag_1" and "flag_2" have a low level. Herein, "tCK" is a period of the clock signal "clk_in".

When "delay_A<tCK<delay_B", the flag signal "flag_1" has a high level, and the flag signal "flag_2" has a low level".

When "tCK>delay_B", both flag signals "flag_1" and "flag_2" have a high level.

In FIG. 4, the flag signals "flag_1" and "flag_2" are applied into inverters INV41 and INV42, respectively. Each output signal of the inverters INV41 and INV42 are applied into a NAND gate NAND46. The NAND gate NAND46 outputs an operation frequency determination signal "dec_0z".

Subsequently, the flag signal "flg_2" is applied into an inverter INV43. An output signal of the inverter INV43 and the flag signal "flag_1" are applied into an NAND gate NAND47. The NAND gate NAND47 outputs an operation frequency determination signal "dec_1z".

Finally, the flag signals "flag_1" and "flag_2" are applied into an NAND gate NAND48. The NAND gate NAND48 outputs an operation frequency determination signal "dec_2z".

FIGS. 5 and 6 are circuit diagrams illustrating an example of the pulse width control section 300 shown in FIG. 3.

FIG. 5 is a circuit for showing a method controlling a delay time of the pulse width control section 300 by using the operation frequency determination signal "dec_2z". FIG. 6, which shows a circuit located between nodes C and D shown in FIG. 5, is a delay circuit for additionally tuning a degree of delay by using the address signals "add_0" and "add_1" when entering into the test mode. That is, the circuit shown in FIG. 6 controls an additional amount of delay time using the address signals "add_0" and "add_1".

Hereinafter, circuits of FIGS. 5 and 6 will be described in detail.

The circuit of FIG. 5 includes a plurality of delay sections 501, 502, 503, and 504, and a plurality of switching units 511, 512, 514, 515 and 516 controlled by the operation frequency determination signals "dec_0z", "dec_1z", and "dec_2z". Each of transformation sections 517 and 518 includes a NAND gate and an inverter connected in series with each other. One input terminal of each of the transformation sections 517 and 518 receives a signal on node A.

In FIG. 5, a total delay time corresponds to a route from node A to node B. Herein, nodes A and B shown in FIG. 5 are identical to nodes A and B of FIG. 3.

A signal inputted through node A of FIG. 5 is either the signal "extyp8" or the signal "icasp6" which is an output signal of the input signal receiving section 310 in FIG. 3.

In FIG. 5, turning on and turning off operations of the switching units 511 and 514 are controlled by the operation frequency determination signals "dec_1z" and "dec_2z". Turning on and turning off operations of the switching unit 512 are controlled by the operation frequency determination signal "dec_0z". Turning on and turning off operations of the switching unit 515 are controlled by the operation frequency determination signal "dec_2z". Turning on and turning off operations of the switching unit 516 are controlled by the test mode signal "tmz_1".

In operation, when output signals of NAND gates NAND51 and NAND52 receiving the operation frequency determination signals "dec_1z" and "dec_2z" have a high level, the switching units 511 and 514 are turned on. Therefore, a signal inputted through node A passes through the delay section 501, the transformation section 517, the delay sections 502 and 503, the transformation section 518, and the switching unit 514. Herein, the switching unit 515 is controlled by the operation frequency determination signal "dec_2z". Therefore, the signal passing through the switching unit 514 is transferred to node C via the delay section 504 when the operation frequency determination signal "dec_2z" has a low level, while the signal passing through the switching unit 514 is transferred directly to node C when the operation frequency determination signal "dec_2z" has a high level.

In operation, when the switching unit 512 is turned on by the operation frequency determination signal "dec_0z", a signal inputted through node A passes through the delay section 501, the transformation section 517, and the switching unit 512. The signal passing through the switching unit 512 is transferred to node C via the delay section 504 when the operation frequency determination signal "dec_2z" has a low level, while the signal passing through the switching unit 512 is transferred directly to node C when the operation frequency determination signal "dec_2z" has a high level.

Subsequently, the signal of node C is transferred to node B through the switching unit 516. As shown in FIGS. 3, 5, and 6, a signal of node C is transferred through either a route of nodes C-B or a route of nodes C-D-B.

In FIG. 5, turning on and turning off operations of the switching unit 516 are controlled by the test mode signal "tmz_1". In the case of a test mode, the test mode signal "tmz_1" is maintained at a low level. In the case of a normal operation mode, the test mode signal "tmz_1" is maintained at a high level.

In the case of the normal operation mode, a signal of node C passes through a route of nodes C-B. That is, the signal of node C is transferred to node B after passing through the switching unit 516, an inverter INV51, and an NAND gate NAND53. Herein, the NAND gate NAND53 receives an output signal of the inverter INV51 and a signal of node A.

In contrast, in the case of the test mode, the signal of node C is transferred to node D via the circuit shown in FIG. 6. The signal transferred to node D is transferred to node B through the switching unit 516, the inverter INV51, and the NAND gate NAND53 shown in FIG. 5.

FIG. 6 shows a circuit diagram illustrating an example of circuits aligned located between nodes C and D of FIG. 5, and is to additionally control an amount of delay time by using address signals.

The circuit of FIG. 6 includes a plurality of delay sections 600, 601, 602, 603, and 604, a plurality of switching units 611, 612, 613, 614, and 615 controlled by address signals, and transformation sections 617 and 618. Each of the transformation sections 617 and 618 includes a NAND gate and an inverter which are connected in series with each other. One terminal of each of the transformation sections 617 and 618 receives a signal on node C. In FIG. 6, a total delay time corresponds to a route from node C to node D. Herein, nodes C and D shown in FIG. 6 are identical to nodes C and D of FIG. 5. As described later in this document, a NAND gate NAND63 of FIG. 6 receives a signal on node C through one input terminal of the NAND gate NAND63.

In FIG. 6, the address signals "add_0" and "add_1", having passed through an inverter, are represented as address bar signals "add_0b" and "add_1b", respectively. As shown in this drawing, selecting signals "sel_3z", "sel_2z", "sel_1z", and "sel_0z", controlling turn on and off operations of switching units, are created by combinations of values of the address signals.

As shown in FIG. 6, when both address signals "add_0" and "add_1" have a low level, the selecting signal "sel_3z" is enabled as a low level. When the address signals "add_0" and "add_1" have a low level and a high level, respectively, the selecting signal "sel_2z" is enabled as a low level. When the address signals "add_0" and "add_1" have a high level and a low level, respectively, the selecting signal "sel_1z" is enabled as a low level. When both address signals "add_0" and "add_1" have a high level, the selecting signal "sel_0z" is enabled as a low level.

In FIG. 6, turning on and turning off operations of each of the switching units 611 and 614 are controlled by the selecting signals "sel_2z" and "sel_3z". Turning on and turning off operations of the switching unit 612 are controlled by the selecting signal "sel_1z". Turning on and turning off operations of the switching unit 613 are controlled by the selecting signal "sel_0z". Turning on and turning off operations of the switching unit 615 are controlled by the selecting signal "sel_3z".

In operation, when both selecting signals "sel_2z" and "sel_3z" have a low level, each of NAND gates NAND141 and NAND62 having received both selecting signals "sel_2z"

and "sel_3z" outputs a high level signal, so that the switching units 611 and 164 are turned on. Therefore, a signal inputted through node C passes through the delay sections 600 and 601, the transformation section 617, the delay sections 602 and 603, and the transformation section 618. Herein, when the selecting signal "sel_3z" has a low level, the signal passing through the delay section 603 passes through the delay section 604 and then is transferred to node D through a NAND gate NAND63 and an inverter INV61. If the selecting signal "sel_3z" has a high level, the signal passing through the delay section 603 is transferred directly to node D through the NAND gate NAND63 and the inverter. INV61. Therefore, when both selecting signals "sel_2z" and "sel_3z" have a low level, the signal passing through the delay section 603 passes through the delay section 604 and then is transferred to node D through the NAND gate NAND63 and the inverter INV61.

In operation, when the selecting signal "sel_1z" has a low level, the switching unit 612 is turned on. Therefore, the signal inputted through node C passes through the delay sections 600 and 601, the transformation section 617, and the delay section 602. In this case, since the selecting signal "sel_3z" has a high level, the signal having passed through the delay section 602 is transferred directly to node D via the NAND gate NAND63 and the inverter INV61. As shown in FIG. 6, the NAND gate NAND63 receives the signal having passed through the switching unit 615 and a signal of node C.

In operation, when the selecting signal "sel_0z" has a low level, the switching unit 613 is turned on. Therefore, the signal inputted through node C passes through the delay section 600. In this case, since the selecting signal "sel_3z" has a high level, the signal having passed through the delay section 600 is transferred to node D via the NAND gate NAND63 and the inverter INV61. Herein, the NAND gate NAND63 receives the signal having passed through the switching unit 615 and a signal of node C.

As shown in FIG. 6, in the case of the test mode, it is possible to control a time delay between node C and node D by using the selecting signals which are generated by combinations of values of the external address signals "add_0" and "add_1". For example, when the test mode signal "tmz_1" has a high level, a delay between nodes C and D does not occur. However, when the test mode signal "tmz_1" has a low level, a route between nodes C and D is enabled, so that a delay route and a delay time between nodes C and D can be controlled depending on address signals.

Figure 7:
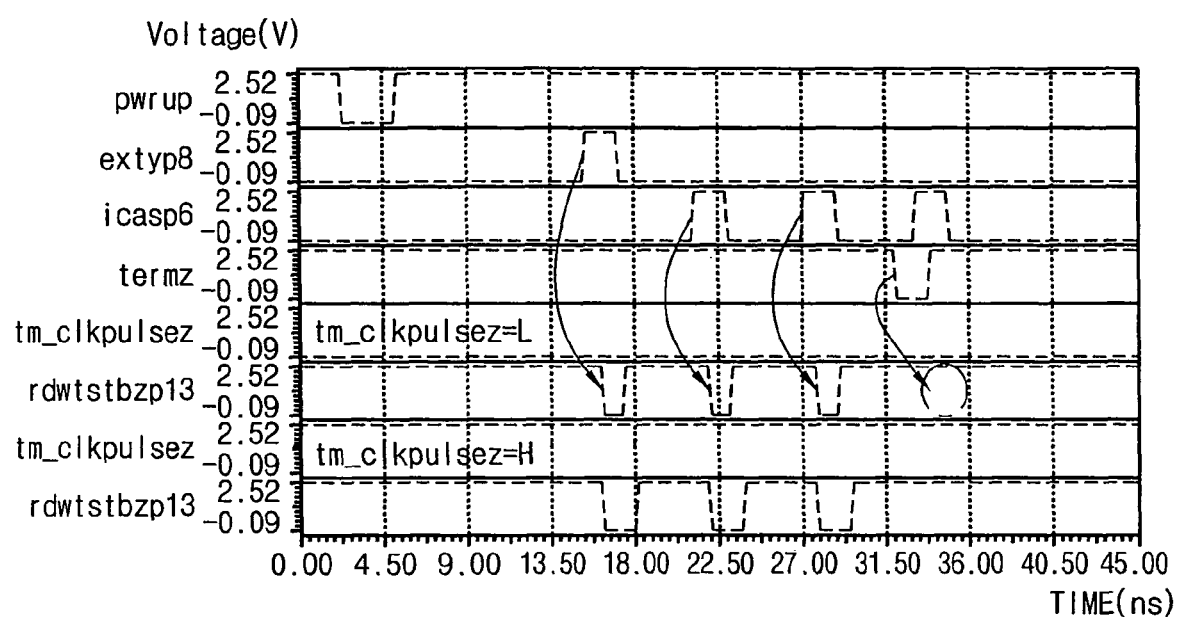
FIG. 7 is a waveform view for explaining the operation of the conventional circuit shown in FIG. 2A.

FIG. 7 is a waveform view for explaining the operation of the conventional circuit shown in FIG. 2A.

As shown in FIG. 7, in the case of the conventional circuit, the pulse width of an output signal "rdwtstbzp13" can be controlled only by logic levels of a signal "tm_clkpulsez".

FIG. 8 is a waveform view of signals used a circuit according to the present invention, in which waveforms of signals used in the circuit shown in FIG. 4 is shown. The waveform view of FIG. 8 includes a clock signal "clk_in", a frequency-division signal "dlic4_ref", a frequency-division signal "dlic4" having an inverted phase, delay signals "dlic4d1" and "dlic4d2", a pulse signal "cmp", flag signals "flag_1" and "flag_2", and operation frequency determination signals "dec_0z", "dec_1z", and "dec_2z".

In FIG. 8, the period of the frequency-division signal "dlic4_ref" is longer than that of "tCK" by four times. The section of a low level of the frequency-division signal "dlic4_ref" is as long as the "tCK". The frequency-division signal "dlic4" having an inverted phase is a signal phase-inverted from the frequency-division signal "dlic4_ref", and is delayed for a predetermined period of time before being outputted.

The frequency-division signal "dlic4" having an inverted phase passes through a delay section having a delay time of "delay_A", thereby being outputted as the delay signal "dlic4d1". Also, the frequency-division signal "dlic4" having an inverted phase passes through a delay section having a delay time of "delay_B", thereby being outputted as the delay signal "dlic4d2". Herein, each high level section of the frequency-division signal "dlic4" having an inverted phase and the delay signals "dlic4d1" and "dlic4d2" is "tCK". FIG. 8 shows a case in which "delay_A" is smaller than "delay_B".

Hereinafter, signal waveforms of FIG. 8 will be described in more detail with reference to the circuit shown in FIG. 4.

In an initial state in which all of the frequency-division signal "dlic4_ref", the delay signal "dlic4d1" and the pulse signal "cmp" have a low level, initial values of all nodes e, f, g, and h have a high level. In this state, if the delay signal "dlic4d1" is shifted into a high level prior to the frequency-division signal "dlic4_ref", the value of node e is shifted into a low level. Subsequently, when the pulse signal "cmp" is shifted into a high level, the value of node h is shifted into a low level, so that the flag signal "flag_1" is shifted into a high level.

In contrast, in the initial state, if the frequency-division signal "dlic4_ref" is shifted into a high level before the delay signal "dlic4d1", node f is shifted into a low level. Subsequently, when the pulse signal "cmp" is shifted into a high level, the value of node g is shifted into a low level, so that the flag signal "flag_1" enters a low level.

As described above, the main point of the circuit shown in FIG. 4 is that a logic level of the flag signal "flag_1" is determined according to a shift sequence of two compared signals "dlic4_ref" and "dlic4d1" to the high level prior to the shift of the pulse signal "cmp" to the high level.

The generation course of the flag signal "flag_2" is practically identical to the generation course of the flag signal "flag_1", so description of the flag signal "flag_2" will be omitted.

The amount of delay time represented as "delay_A" and "delay_B" is to judge a frequency range of the clock signal "clk_in". For example, if the rising edge of the delay signal "dlic4d1" precedes the rising edge of the frequency-division signal "dlic4_ref", an amount of the "delay_A" is shorter than the period of the clock signal "clk_in". Similarly, if the rising edge of the delay signal "dlic4d2" follows the rising edge of the frequency-division signal "dlic4_ref", the amount of the "delay_B" is longer than the period of the clock signal "clk_in". Therefore, in this case, a relation of "delay_A<tCK<delay_B" is obtained. FIG. 8 shows waveforms of signals in the case of satisfying such a condition.

Figure 9:
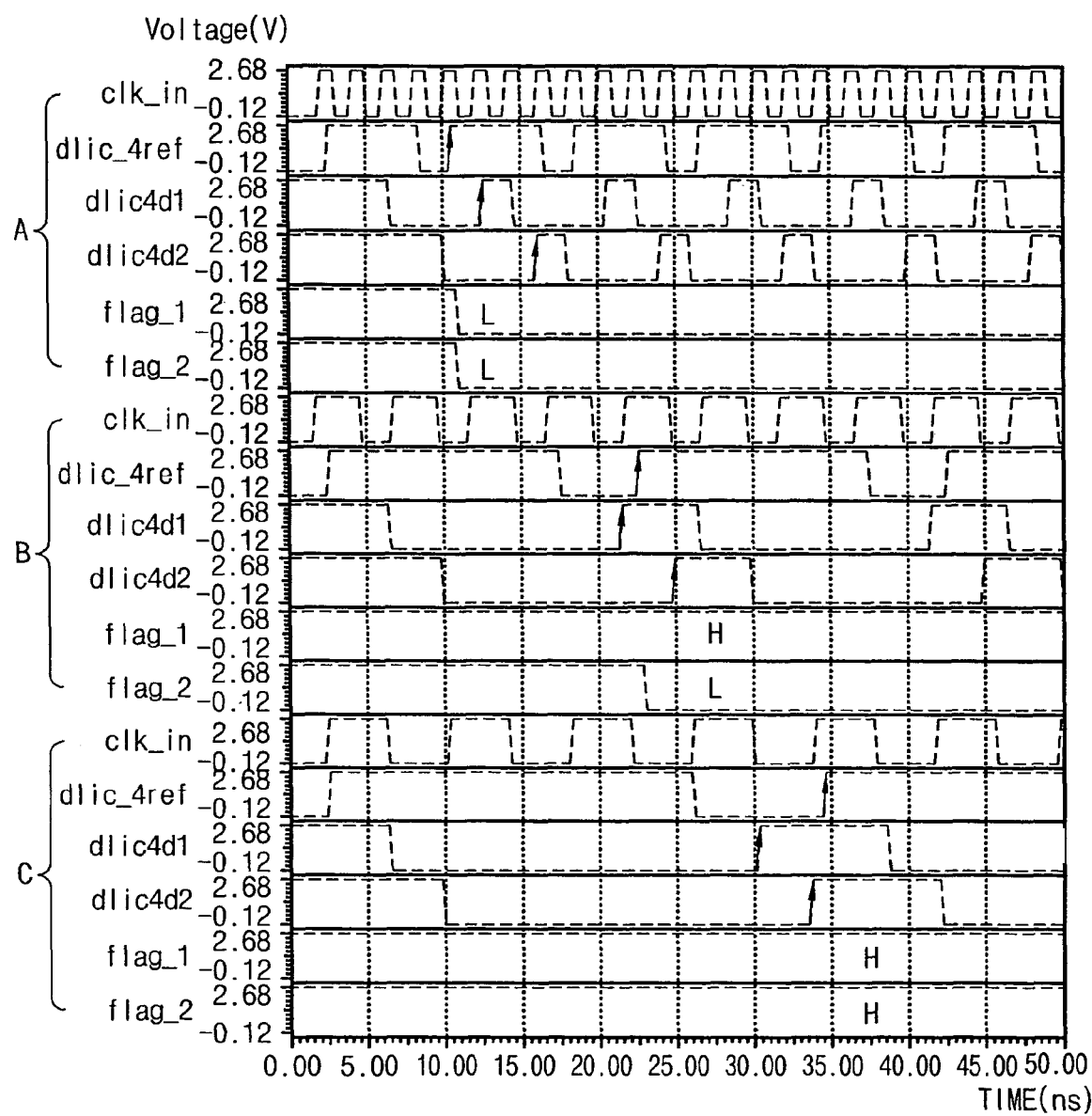
FIG. 9 is a waveform view illustrating variation of logic levels of flag signals "flag_1" and "flag_2" depending on frequencies of clock signals "clk_in"

FIG. 9 is a waveform view illustrating variation of logic levels of flag signals "flag_1" and "flag_2" depending on frequencies of clock signals "clk_in". In FIG. 9, a condition of "delay_A<delay_B" is satisfied.

As shown as "A" in FIG. 9, when "tCK<delay_A", both flag signals "flag_1" and "flag_2" have a low level.

As shown as "B" in FIG. 9, when "delay_A<tCK<delay_B", the flag signal "flag_1" has a high level and the flag signal "flag_2" has a low level.

As shown as "C" in FIG. 9, when "tCK>delay_B", both flag signals "flag_1" and "flag_2" have a high level.

As described above, it is understood that each flag signal includes operational frequency information of the memory device. The logic level of each of the operation frequency determination signals "dec_0z", "dec_1z", and "dec_2z" is determined by these flag signals. A delay route of the circuit shown in FIG. 5 is determined according to the logic levels of the operation frequency determination signals "dec_0z", "dec_1z", and "dec_2z".

Figure 10:
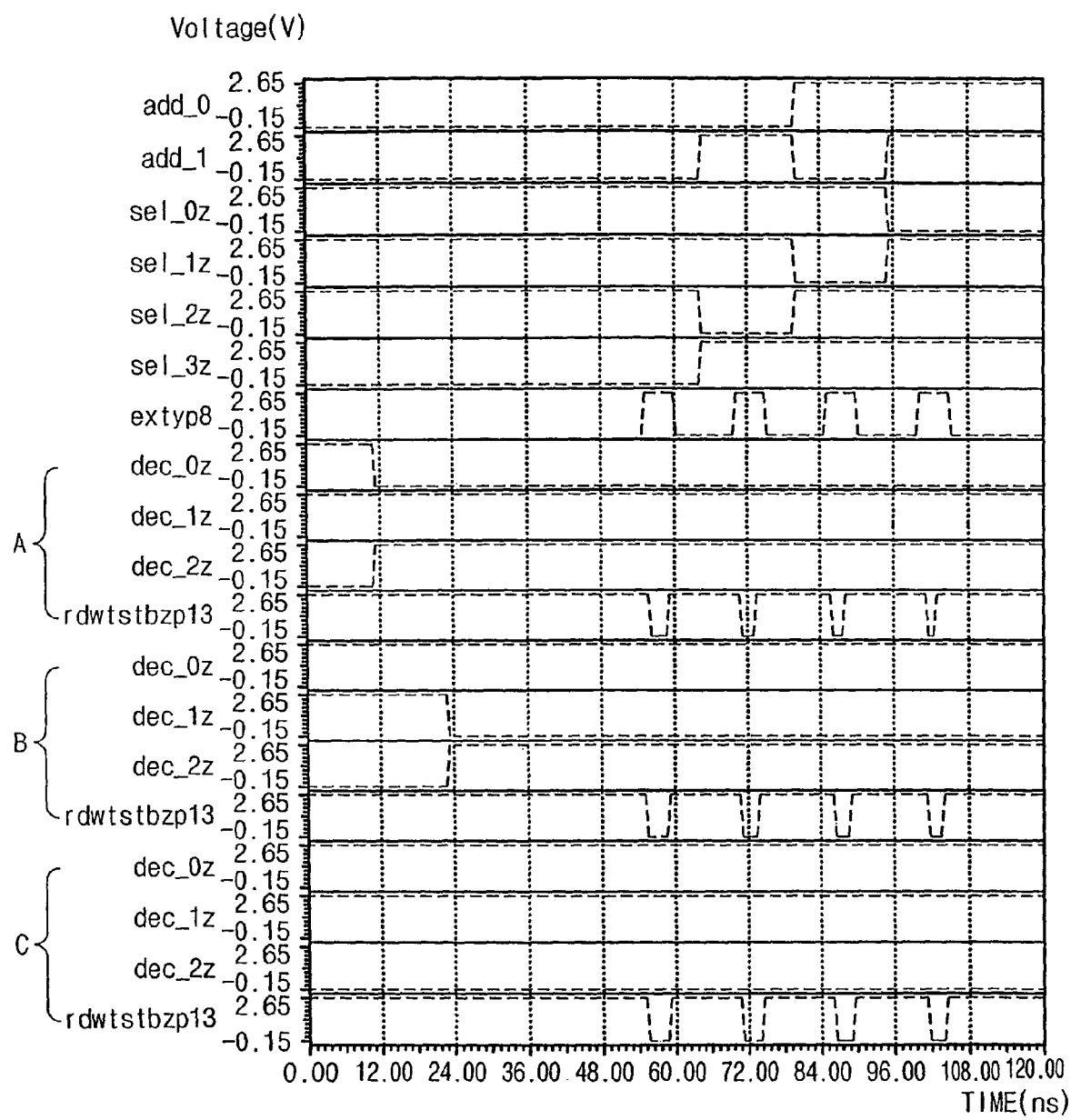
FIG. 10 is a view illustrating waveforms of an output signal "rdwtstbzp13" when a route between nodes C and D shown in FIG. 6 is used.

FIG. 10 is a view illustrating waveforms of an output signal "rdwtstbzp13" when a route between nodes C and D shown in FIG. 6 is used. As described above, FIG. 6 is a circuit diagram used when entering into the test mode by the test mode signal "tmz_1" shown in FIG. 5. That is, during the test mode, it is possible to additionally control the amount of the delay time by applying address signals to the circuit in which a frequency route has been determined.

FIG. 10 illustrates the selecting signals "sel_3z", "sel_2z", "sel_1z", and "sel_0z" obtained through combinations of the address signals as described with reference to FIG. 6.

"A" of FIG. 10 represents waveforms of an input signal "extyp8" and its output signal "rdwtstbzp13" when the operation frequency determination signals "dec_2z" and "dec_1z" have a high level and the operation frequency determination signal "dec_0z" has a low level.

"B" of FIG. 10 represents waveforms of an input signal "extyp8" and its output signal "rdwtstbzp13" when the operation frequency determination signals "dec_0z" and "dec_2z" are a high level and the operation frequency determination signal "dec_1z" has a low level.

"C" of FIG. 10 represents waveforms of an input signal "extyp8" and its output signal "rdwtstbzp13" when the operation frequency determination signals "dec_0z" and "dec_1z" have a high level and the operation frequency determination signal "dec_2z" has a low level.

As shown in "A", "B", and "C" of FIG. 10, it is understood that, as the delay route shown in FIG. 6 becomes shorter by controlling the address signals, the pulse width of the output signal "rdwtstbzp13" becomes shorter.

As described above, the present invention provides a method of sensing the operational frequency of the memory device and automatically controlling an operation of the "Yi" pulse signal.

When the circuit and the method of the present invention are used, the pulse width of the "Yi" signal is automatically controlled, so that it is unnecessary to perform FIB work for delay tuning whenever the operational frequency is varied. Therefore, fabricating cost and time are reduced as compared with the prior art.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for controlling an enable time of a signal controlling an operation of data buses of a memory device, the method comprising the steps of:
    (a) generating a first signal having a first pulse width according to a burst operation command;
    (b) generating N-1 number of second signals having a second pulse width, in which N is a burst length;
    (c) receiving the first signal and the second signals, detecting and receiving a clock signal of the memory device for modulating the pulse width output of the logically operated first signal and the second signals, and outputting third signals; and
    (d) changing the pulse width of the signal controlling the operation of data buses that connect a bit line sense amplifier with a data sense amplifier using the logically operated third signals;
    wherein the pulse width of the signal controlling the operation of the data buses is automatically changed according to a frequency of the clock signal.

2. The method as claimed in claim 1, further comprising a step of additionally automatically controlling the pulse width of the third signal by using an address signal in step (c).

3. A method for controlling an enable time of signal controlling an operation of data buses of a memory device, the method comprising the steps of:
    (a) receiving an input signal;
    (b) detecting and receiving a clock signal provided to the memory device for modulating the pulse width output of the logically operated input signal, and outputting a first signal; and
    (c) changing the pulse width of the signal controlling the operation of data buses that connect a bit line sense amplifier with a data sense amplifier by using the logically operated first signal.

4. The method as claimed in claim 3, further comprising a step of additionally controlling the pulse width of the first signal by using an address signal in step (b).

5. A method for controlling an enable time of a signal controlling an operation of data buses of a memory device, the method comprising the steps of:
    (a) generating a first signal in response to a burst operation command, the first signal having a first pulse width;
    (b) generating and receiving the first signal to generate N-1 number of second signals each second signal having a second pulse width such that the first and second signals form N strobe pulse signals in which each strobe pulse signal has a strobe pulse width, in which N is a burst length;
    (c) receiving the N strobe pulse signals, a clock signal, a test mode signal and a plurality of address signals, and automatically changing the strobe pulse width of each strobe pulse signal as a function of the clock signal, the test mode signal and the address signals wherein
    when not in a test mode induced by a first level of the test mode signal, changing the strobe pulse width of each strobe pulse signal as a function of the clock signal by controlling switching around and through various delay paths that the N strobe pulse signals traverse,
    when in the test mode induced by a second level of the test mode signal, changing the pulse width of each strobe pulse signal as a function of the address signals by controlling switching around and through other delay paths that the N strobe pulse signals traverse; and
    (d) controlling data bus operations that connects a bit line sense amplifier with a data sense amplifier using the logically operated N strobe pulse signals having the changed pulse widths.

* * * * *